US009214232B2

(12) United States Patent
Mangalindan et al.

(10) Patent No.: US 9,214,232 B2
(45) Date of Patent: Dec. 15, 2015

(54) METHODS AND APPARATUSES FOR CALIBRATING DATA SAMPLING POINTS

(75) Inventors: Paolo E. Mangalindan, Rancho Cordova, CA (US); Alberto Troia, Carlentini (IT); Yihua Zhang, Folsom, CA (US); Poorna Kale, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 559 days.

(21) Appl. No.: 13/559,319

(22) Filed: Jul. 26, 2012

(65) Prior Publication Data

US 2014/0032815 A1  Jan. 30, 2014

(51) Int. Cl.
| | |
|---|---|
| *G06F 12/00* | (2006.01) |
| *G11C 16/00* | (2006.01) |
| *G06F 13/16* | (2006.01) |
| *H04L 1/24* | (2006.01) |
| *G06F 13/42* | (2006.01) |
| *G11C 7/22* | (2006.01) |
| *G11C 11/4076* | (2006.01) |
| *G11C 29/02* | (2006.01) |
| *G06F 1/12* | (2006.01) |
| *G06F 1/32* | (2006.01) |
| *H04L 7/10* | (2006.01) |

(52) U.S. Cl.
CPC ............ *G11C 16/00* (2013.01); *G06F 13/1689* (2013.01); *G06F 13/4243* (2013.01); *H04L 1/24* (2013.01); *G06F 1/12* (2013.01); *G06F 1/324* (2013.01); *G11C 7/22* (2013.01); *G11C 7/222* (2013.01); *G11C 7/225* (2013.01); *G11C 11/4076* (2013.01); *G11C 29/023* (2013.01); *G11C 2207/2254* (2013.01); *H04L 7/10* (2013.01)

(58) Field of Classification Search
CPC ............... G11C 7/222; G11C 11/4076; G11C 2207/2254; G11C 7/22; G11C 7/225; G11C 29/023; G06F 1/324; G06F 1/12
USPC ......................................... 711/103, 154, 167
See application file for complete search history.

(56) References Cited

U.S. PATENT DOCUMENTS

| | | | |
|---|---|---|---|
| 6,249,823 B1 * | 6/2001 | Zervens et al. ................... | 710/5 |
| 7,228,372 B2 | 6/2007 | Yoshimura et al. | |
| 7,495,970 B1 | 2/2009 | Tang et al. | |
| 7,676,684 B2 * | 3/2010 | Ando ............................. | 713/400 |

(Continued)

OTHER PUBLICATIONS

"MirrorBit Flash Non-Volatile Memory CMOS 3.0 Volt Core With Versatile I/O Serial Peripheral Interface with Multi-I/O", www.spansion.com/Support/Datasheets/S25FL128S256 00.pdf, Mar. 22, 2012.

*Primary Examiner* — Mardochee Chery
(74) *Attorney, Agent, or Firm* — Dorsey & Whitney LLP

(57) ABSTRACT

Methods and apparatuses for calibrating data sampling points are disclosed herein. An example apparatus may include a memory that may be configured to receive a calibration command and an attribute. The memory may include a first register that is configured to store a tuning data pattern and a second register that is configured to receive and store the tuning data pattern stored in the first register. The second register may be further configured to store the tuning data pattern responsive, at least in part, to the memory receiving the calibration command. The memory may be configured to execute an operation on at least one of the tuning data pattern stored in the first register or the tuning data pattern stored in the second register based, at least in part, on the attribute.

28 Claims, 13 Drawing Sheets

(56) References Cited

U.S. PATENT DOCUMENTS

| | | |
|---|---|---|
| 7,689,740 B2 | 3/2010 | Chou |
| 7,725,803 B1 | 5/2010 | Tang et al. |
| 7,793,031 B2 | 9/2010 | Sartori et al. |
| 8,086,761 B2 | 12/2011 | Huang et al. |
| 8,122,173 B2 | 2/2012 | Liao |
| 8,639,865 B2 * | 1/2014 | Grunzke .................. 710/74 |
| 8,681,839 B2 * | 3/2014 | Bulzacchelli et al. ........ 375/220 |
| 8,767,531 B2 * | 7/2014 | Ferraiolo et al. .............. 370/225 |

* cited by examiner

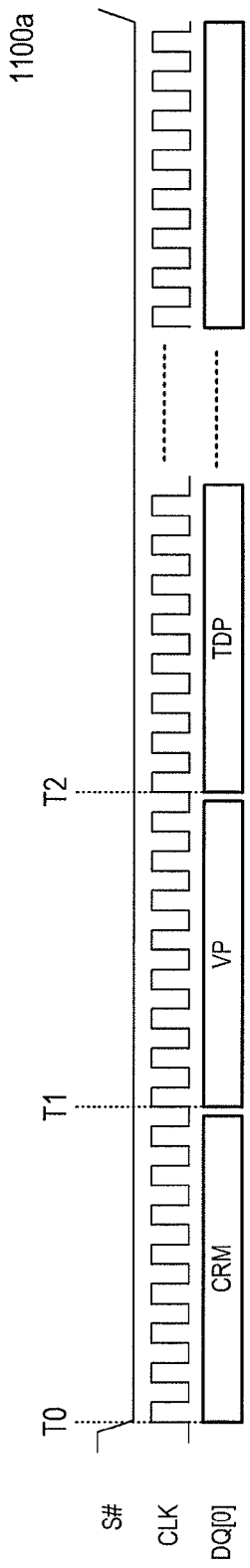
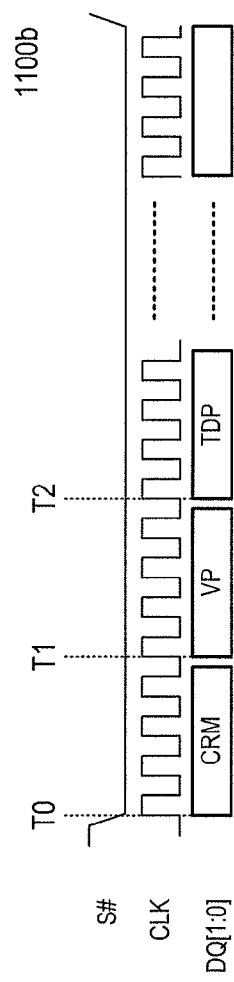
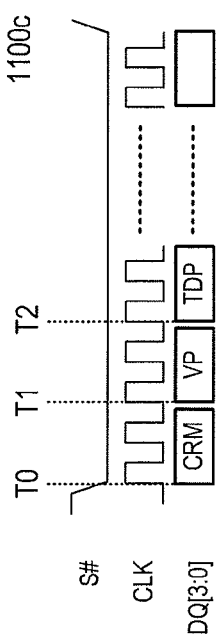

ions and Apparatuses for Calibrating Data Sampling Points

TECHNICAL FIELD

Embodiments of the present invention described herein relate generally to memories, and more particularly, in one or more of the illustrated embodiments, to calibration of data sampling points.

BACKGROUND OF THE INVENTION

As speeds and complexity of devices such as memory devices, have increased, so has the frequency at which data is provided to and received from these devices. Various methodologies have been used to accomplish this, including high speed serial communication using, for example, the serial peripheral interface (SPI) protocol. While high speed serial communication has been successful in allowing for higher data transmission frequencies, the increased frequencies have decreased the width of the "data eye" of data signals. That is, the amount of time in which a particular bit of a signal is available to be captured by a device is diminished. This in turn reduces tolerances for capturing data, and data transmission may be more prone to errors as a result.

To account for this, several different approaches have been utilized. One such approach comprises the use of strobe signals, wherein signals are provided in parallel with data, indicating to a device when each bit of the data should be captured. Some implementations do not use strobe signals, however, as the extra signal may be infeasible for a particular design. Thus, some designs may instead rely on calibration of device timings. That is, a device capturing data from a bus may be calibrated to capture data at specific times relative to a signal, such as a clock signal. This approach may incur its own set of challenges, however, as calibrations may not be effective for varying operating conditions, and/or may not configure a device for accurate detection of all possible data patterns.

BRIEF DESCRIPTION OF THE DRAWINGS

FIGS. 11 a-c are timing diagrams illustrating a volatile program operation of the apparatus of FIG. 1 according to an embodiment of the invention.

DETAILED DESCRIPTION

Methods and apparatuses for calibrating data sampling points are disclosed herein. In accordance with one or more embodiments of the present invention, a tuning data pattern (TDP) may be provided from a memory to calibrate data sampling points of a device, such as a host coupled to the memory. Certain details are set forth below to provide a sufficient understanding of embodiments of the invention. However, it will be clear to one having skill in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Embodiments of the present invention may be utilized with various interfaces. For example, some embodiments may be utilized with a serial peripheral interface bus protocol. The serial peripheral interface bus protocol is a serial data link standard wherein one or more slave devices may be coupled to a master device over a bus and controlled by the master with individual slave select (e.g., chip select) signals. More specifically, each of the slave devices may operate based, at least in part, on a clock signal provided to each of the slave devices by the master device, and information (e.g., commands, attributes, addresses, and data) may be provided between the slaves and the master using one or more I/O lines. The master may, for example, communicate using full duplex communication, and further may communicate with each slave device independently or may communicate with slave devices arranged in a daisy-chain configuration.

Figure 1:
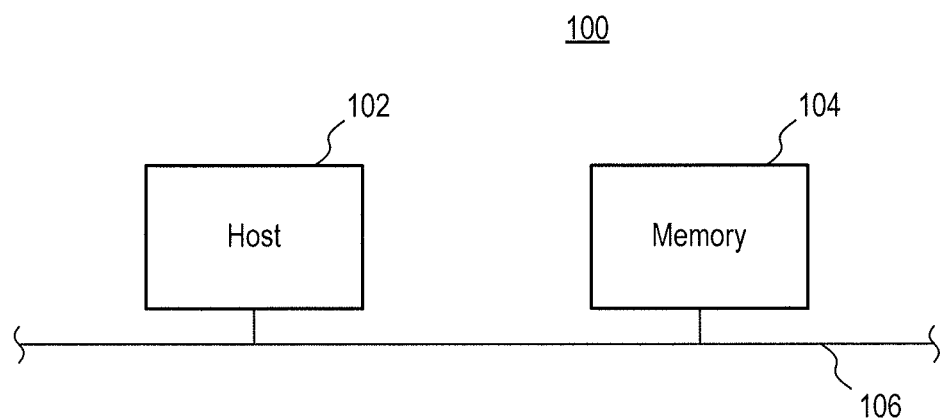
FIG. 1 is a block diagram of an apparatus according to an embodiment of the present invention.

FIG. 1 is a block diagram of an apparatus 100 according to an embodiment of the present invention. The apparatus 100 may comprise circuitry, one or more semiconductor dice, a packaged semiconductor, a device including such circuitry, die, or package, and/or a system including such a device, and may include a host 102 and a memory 104. The host 102 may comprise a controller (e.g., memory controller), central processing unit (CPU), and/or any other device known in the art that may be configured to provide one or more memory commands. The memory 104 may comprise any memory, including volatile memory, such as dynamic random access memory (DRAM) and/or non-volatile memory, such as NAND or NOR flash memory. The host 102 and the memory 104 may each be coupled to a serial peripheral interfaces (SPI) bus 106 and may communicate over the SPI bus 106 in accordance with SPI protocol such that information may be provided between the host 102 and the memory 104 using, for example, 1, 2, 3, or 4 I/O lines. Both the host 102 and the memory 104 may be configured as a slave or master in accordance with SPI protocol, and any other number of slave and/or master devices (not shown in FIG. 1) may be coupled to the SPI bus 106 as well.

The memory 104 may be configured to provide a tuning data pattern that may comprise any number and/or sequence of bits. In one embodiment, for example, the memory 104 may provide the tuning data pattern over the SPI bus 106, and/or may simultaneously provide a same tuning data pattern over each I/O line of the SPI 106. In other embodiments, the memory 104 may simultaneously provide different tuning data patterns over each respective I/O line of the SPI bus 106. Any number of tuning data patterns may be provided over the SPI bus 106 to any number of devices, including the host 104, and in at least one embodiment, tuning data patterns may be provided before read data is provided. As will be explained in more detail below, providing a tuning data pattern in this manner may, for example, allow the host 102 to calibrate sampling points such that data provided by the memory 104 may be properly captured. Calibrating in this manner may allow the host 102 to calibrate one or more sampling points to compensate for factors inducing timing variations, such as silicon processes, PCB loads, voltage variations, and/or temperature fluctuations.

In one embodiment, for example, the memory 104 may be configured to provide tuning data patterns for long calibrations and short calibrations. When providing a tuning data pattern for a long calibration, the memory 104 may operate in a long calibration mode, wherein the memory 104 may provide one or more tuning data patterns over the SPI bus 106 at a first frequency. The memory 104 may subsequently provide the same tuning data pattern at a second frequency that may be faster than the first frequency. The memory 104 may provide the tuning data pattern at the second frequency as many times as is necessary for a device, such as the host 102, to calibrate a sampling point for capturing data provided by the memory 104. Because the memory 104 may act as a slave in accordance with SPI protocol, the frequencies at which the tuning data patterns are provided, such as the aforementioned first and second frequencies, may be based, at least in part, on a clock signal provided to the memory 104.

When providing a tuning data pattern for a short calibration, the memory 104 may operate in a short calibration mode where, in response to a command, the memory 104 may provide a tuning data pattern to the SPI bus 106 before or during execution of an operation corresponding to the received command. For example, in response to receipt of a read command, the memory 104 may provide a tuning data pattern to the host 102 over the SPI bus 106 before providing the read data requested by the read command. This may allow a device, such as the host 102, to calibrate one or more sampling points such that the read data following the tuning data pattern may be properly captured. In at least one embodiment, the memory 104 may be configured to provide tuning data patterns in this manner based, at least in part, on the logic state (e.g., logic high) of a short calibration flag. Additionally, while the short calibration mode has been described herein as causing the memory 104 to provide a tuning data pattern for each read command, in other embodiments, a tuning data pattern may be provided at other intervals, such as for every other read command, and/or based on other factors as well, such as variation in temperature or an amount of time since the last tuning data pattern was provided. It will be appreciated by those having ordinary skill in the art that other implementations may be used without departing from the scope and spirit of the invention.

Long calibrations may use a tuning data pattern that is longer (e.g., have longer series of data bits) than a tuning data pattern for short calibrations. For example, the long tuning data pattern may be 128-bits long, whereas the short data tuning pattern may be 8-bits long. Long and short data tuning patterns of different lengths than those described may be used as well without departing from the scope of the invention. Generally long data tuning patterns are longer than short data tuning patterns. Long calibrations may be used, for example, for tuning of a data strobe relative to a clock signal. Short calibrations may be used, for example, to track variations in the operation of a memory and/or host, and for fine tuning of the strobe window relative to a clock signal.

Figure 2:
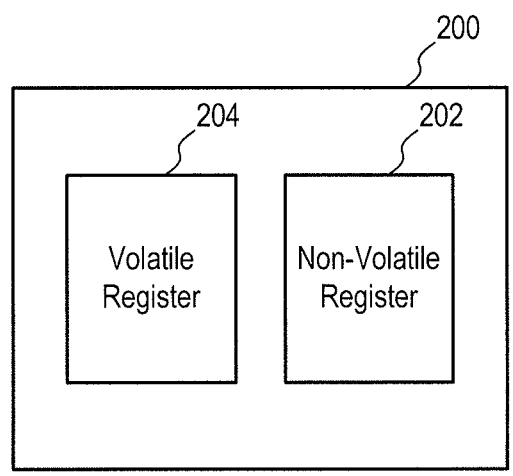
FIG. 2 is a block diagram of a memory according to an embodiment of the present invention.

FIG. 2 is block diagram of a memory 200 according to an embodiment of the invention. The memory 200 may be used to implement the memory 104 of FIG. 2. The memory 200 includes a non-volatile register 202 and a volatile register 204. The non-volatile register 202 may be non-volatile storage (e.g., flash memory) and may be configured to store one or more tuning patterns. The tuning data patterns stored in the non-volatile register 202 may be customer- or factory-specific patterns, and/or may be unique to the non-volatile register 202 of the memory 200.

The volatile register 204 may be volatile memory (e.g., DRAM) and may be configured to store tuning data patterns received, for instance, from the non-volatile register 202 and/or the host 102. In some embodiments, the non-volatile register 202 may provide tuning data patterns to the volatile register 204 during an initialization of the apparatus 100 or responsive to the memory 200 receiving a calibration register mode (CRM) command. As will be explained in further detail below, a CRM command may allow operations (e.g., read operations) to be executed on tuning data patterns stored in the volatile register 204 and/or the non-volatile register 202. In one embodiment, the memory 200 may be configured to erase, modify, and/or refresh respective tuning data patterns in the non-volatile register 202 and the volatile register 204 based, at least in part, on attribute bits provided with a CRM command.

Moreover, in some embodiments, the volatile register 204 may act as a buffer between the host 102 and the non-volatile register 202. For example, when a host 102 executes a read operation of a tuning data pattern from the non-volatile register 202, the memory 104 may provide the tuning data pattern from the non-volatile memory 202 to the volatile register 204, and the tuning data pattern may then be provided from the volatile register 204 to the host 102. Similarly, when a host 102 executes a write operation of a tuning data pattern to the non-volatile register 202, the tuning data pattern may be first written to the volatile register 204, and the tuning data pattern subsequently written to the non-volatile register 202. In other embodiments, the volatile register 304 may operate independently. That is, the host 102 may read from and/or write to the volatile memory 204 without data being read from or written to the non-volatile register 202.

Figure 3:
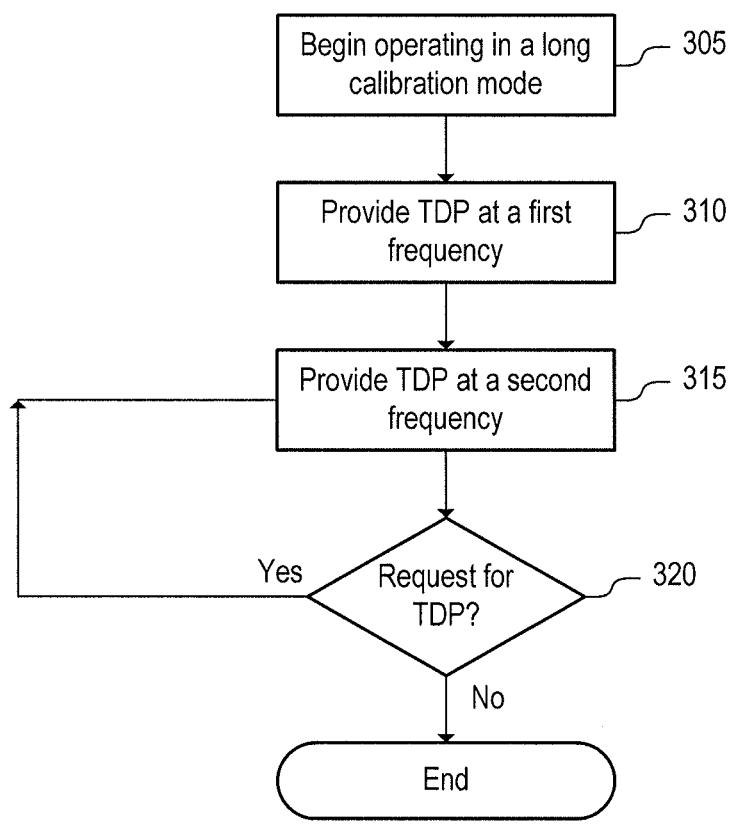
FIG. 3 is a flowchart for a method according to an embodiment of the invention that may be used by a memory to provide tuning data patterns to a host.

FIG. 3 is a flowchart of a method 300 according to an embodiment of the invention that may be used by a memory 104 to provide tuning data patterns to the host 102. More specifically, with reference to FIG. 1, the method 300 may be used by the memory 104 in a long calibration mode, as described above.

At step 305, the memory 104 may begin to operate in a long calibration mode, and at step 310, may provide a tuning data pattern to the host 102 at a first frequency (e.g., a relatively low frequency). As described, the host 102 may comprise a master device and the memory 104 may comprise a slave device in accordance with the SPI protocol. As a result, in at least one embodiment, the memory 104 may provide the tuning data pattern at a frequency based, at least in part, on a clock signal provided to the memory 104 by the host 102. The frequency of the clock signal provided at step 310 may be relatively low such that the host 102 may accurately capture the tuning data pattern provided by the memory 104. Once the host 102 has received the tuning data pattern from the memory 104, the tuning data pattern is provided to the host 104 at a second frequency (e.g., higher than the relatively low frequency). As discussed, the tuning data pattern may be provided at a frequency based, at least in part, on the frequency of the clock signal provided to the memory 104. Thus, by increasing the frequency of the clock signal provided to the memory 104 by the host 102, the tuning data pattern may be provided at a higher frequency at step 315 than at method step 310. At step 320, the memory 104 may again provide the tuning data pattern, for example, responsive to a request from the host 102. The memory 104 may provide the tuning data pattern at the second frequency until the tuning data pattern is accurately captured at the second frequency.

Figure 4:
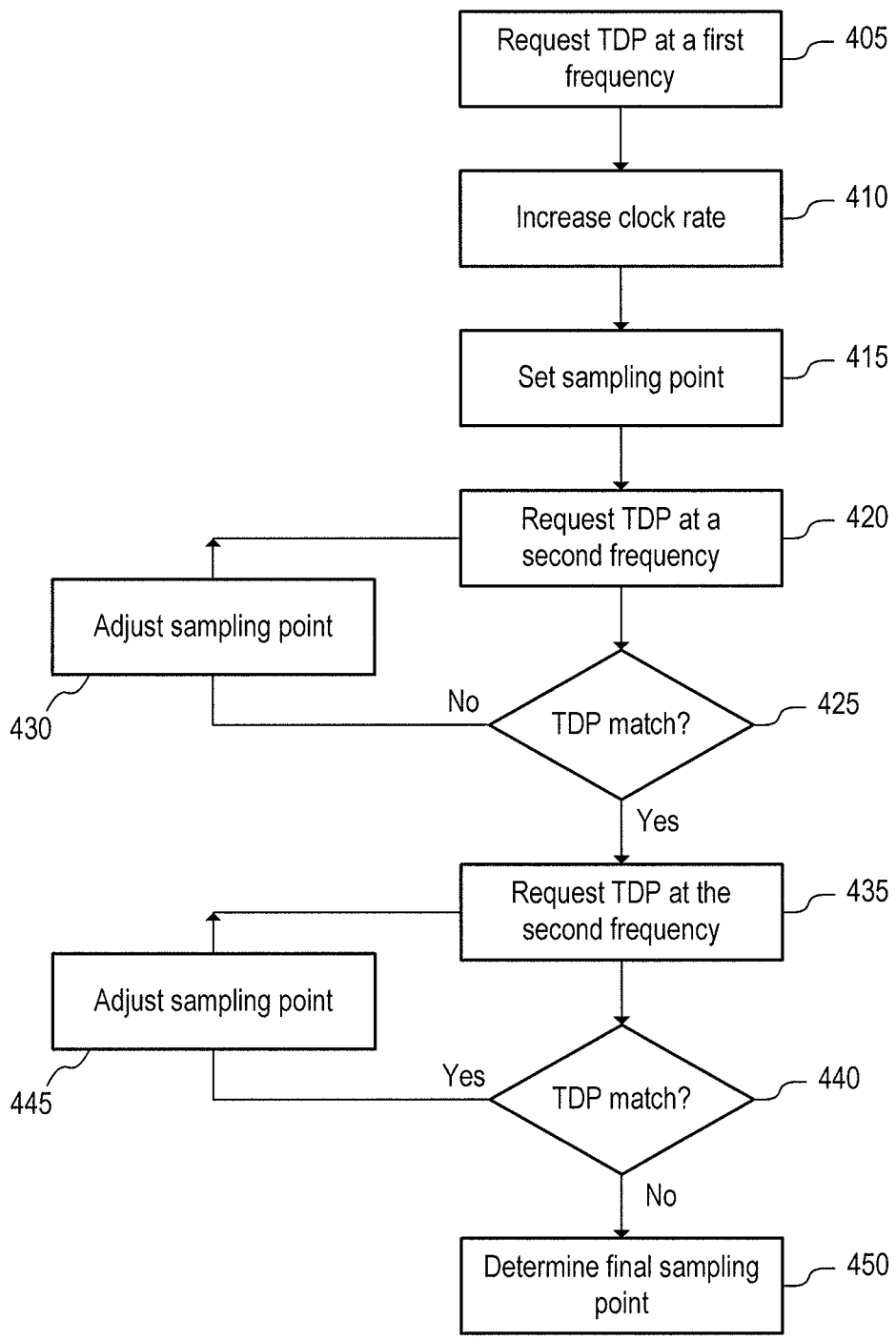
FIG. 4 is a flowchart for a method according to an embodiment of the invention that may be used to calibrate the data sampling point of a host.

FIG. 4 is a flowchart for a method 400 according to an embodiment of the invention that may be used to calibrate the sampling point of the host 102 of FIG. 1. More specifically, with reference to FIG. 1, the method 400 may be used to calibrate the host 102 with the memory 104 operating in a long calibration mode.

At step 405, the host 102 may request a tuning data pattern, for instance, from the memory 104, at a first frequency (e.g., at a relatively low frequency). As described, the first frequency may be based, at least in part, on the frequency of the clock provided by the host 102 to the memory 104. Moreover, in accordance with embodiments of the invention, the host 102 may request the tuning data pattern by providing a CRM command and a read volatile (RV) attribute, as described in further detail below. Once the tuning data pattern has been received, at step 410, the host 102 may request the tuning data pattern to be provided at a second frequency (e.g., at a higher frequency than the relatively low frequency).

At step 415, the host 102 may set a sampling point for capturing data provided from the memory 104 to the host 102. In one embodiment, the host 102 may set the sampling point, for instance, at a first clock edge (e.g., rising clock edge) of the clock signal provided to the memory 104, or may set the sampling point at both rising and falling clock edges to operate at double data rate (DDR). Once the sampling point has been set, the host 102 may request the tuning data pattern at the second frequency at step 420. If the host determines at step 425 that the tuning data pattern received at the second frequency does not match the tuning data pattern received at the first frequency, the host 102 may adjust the sampling point (e.g., shift the timing of the sample point) at step 430 and repeat the request of the tuning data pattern at step 420.

If the host 102 determines at step 425 that the tuning data pattern received at the second frequency matches the tuning data pattern received at the first frequency, the host 102 may again request the tuning data pattern at the second frequency at step 435. If the host determines that there is another match at step 440, the host 102 may adjust the sampling point at step 445 and re-request the tuning data pattern at step 435. If the host 102 determines at step 440 that there is not a match, the host 102 may determine a final sampling point for capturing data at step 450. In at least one embodiment, the final sampling point may comprise an average between the sampling point determined to provide a match at step 425 and sampling point at step 440 to not provide a match.

Figure 5:
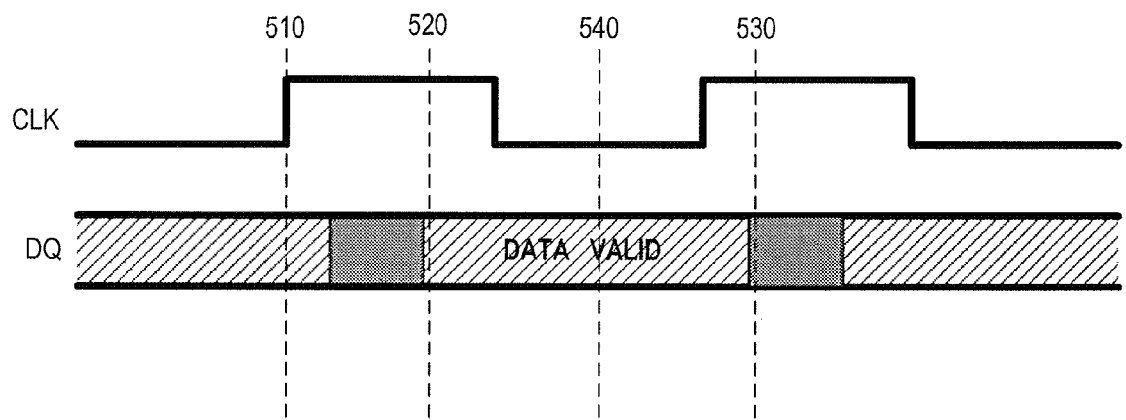
FIG. 5 is a timing diagram illustrating the calibration of a sampling point by a host according to an embodiment of the invention.

FIG. 5 is a timing diagram 500 illustrating the calibration of a sampling point by a host 102 according to an embodiment of the invention. The timing diagram 500 may include a clock signal CLK provided by the host 102 to the memory 104 and data received on an I/O line DQ provided between the host 102 and the memory 104 in accordance with the SPI protocol. With reference to FIG. 4, and in particular, as described with respect to the method step 415, the host 102 may set a sampling point at the sampling point 510, a first edge of the clock signal CLK. As described with respect steps 420, 425, and 430, the host 102 may repeatedly request tuning data patterns from the memory 104, adjusting the sampling point (e.g., change the timing of the sampling point) in each iteration, until the sampling point reaches the sampling point 520, wherein data may be properly captured (i.e., "data valid"). The host 102 may again request tuning data patterns and adjust the sampling point until the sampling point reaches the sampling point 530, wherein data is no longer properly captured, as described with respect to steps 435, 440, and 445. Accordingly, the host 102 may set a final sampling point between the sampling points 520 and 530. The host 102 may set the final sampling point, for example, half way between the sampling points 520 and 530, for example, at sampling point 540.

Figure 6:
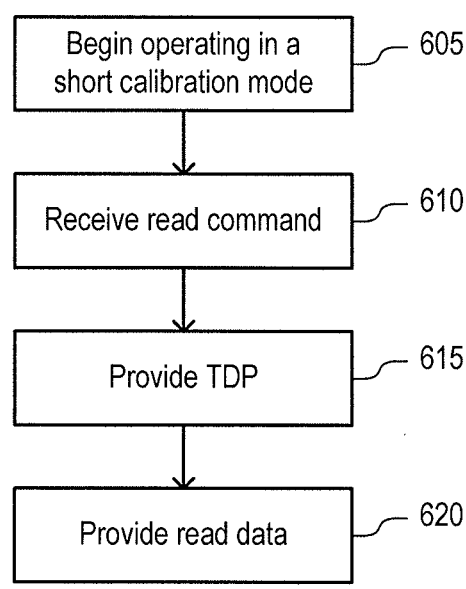
FIG. 6 is a flowchart for a method according to an embodiment of the invention that may be used by a memory to provide tuning data patterns to a host.

FIG. 6 is a flowchart of a method 600 according to an embodiment of the invention that may be used by a memory 104 to provide tuning data patterns to the host 102. More specifically, with reference to FIG. 1, the method 600 may be used by the memory 104 in a short calibration mode, as described above.

At step 605, the memory 104 may begin to operate in a short calibration mode. As explained, the memory 104 may operate in a short calibration mode based, at least in part, on the state of a short calibration flag. This flag may be included in the memory 104 and further may be included in volatile and/or non-volatile memory of the memory 104. At step 610, the memory 104 may receive a read command from the host 102. In response to the read command, the memory 104 may provide a tuning data pattern to the host 102 at step 615. The host 102 may, for example, use the tuning data pattern to calibrate a sampling point. At step 620, the memory 104 may provide read data corresponding to the read command to the host 102. The host 102 may capture the read data using the one or more calibrated sampling points.

As described, the memory 200 (FIG. 2) may be configured to receive CRM commands that permit execution of various operations directed to tuning data patterns stored in the volatile register 204 and the non-volatile register 202 of the memory 200. An attribute may be provided with each CRM command, indicating the specific requested operation. Attributes may be directed to operations such as erase, refresh, programming, or read operations of one or more tuning data patterns stored in the memory 200. For example, as previously discussed, the memory 200 may be placed into a long calibration mode, wherein a host may calibrate a sampling point based on one or more tuning data patterns provided by the memory 200. In one embodiment, for example, the memory 200 may be configured to provide each tuning data pattern in this manner responsive to a calibration register mode command and an attribute designating a read volatile (RV) operation. Attributes may further indicate if an operation is intended for the non-volatile register 202 or for the volatile register 204. In some embodiments attributes may have a bit length of 4, 8, or 16 bits, or may comprise any other bit length.

FIGS. 7a-c, 8a-c, 9a-c, 10a-c, 11a-c, 12a-c, and 13 are timing diagrams 700a-c, 800a-c, 900a-c, 1000a-c, 1100a-c, 1200a-c, and 1300, respectively, illustrating example operations of the apparatus 100 in accordance with various embodiments of the invention. Each of the timing diagrams 700a-c, 800a-c, 900a-c, 1000a-c, 1100a-c, 1200a-c, and 1300 includes a select signal S#, a clock signal CLK, and information (e.g., commands, attributes, addresses, and data) received on I/O lines. The select signal S# and the clock signal CLK may comprise a slave select signal (active low) and a clock signal in accordance with the SPI protocol, respectively, and may be provided from the host 102 to the memory 104 over the SPI bus 106. Moreover, the information received on the I/O lines may be over the SPI bus 106, which may have a width of 1, 2, or 4 bits, as explained in more detail below.

Figure 7A:
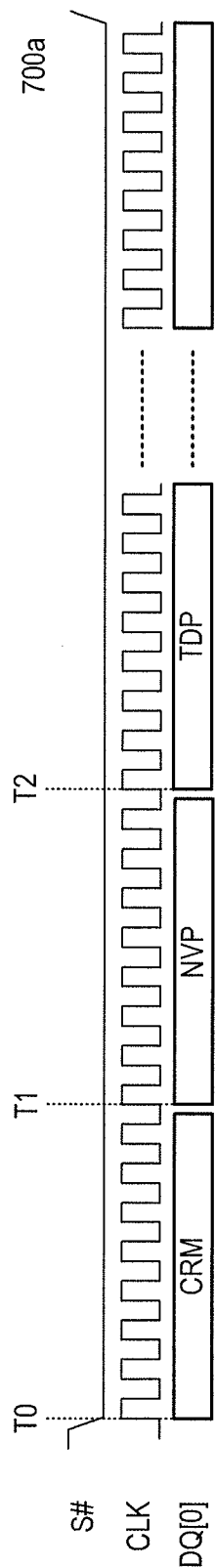
FIGS. 7a-c are timing diagrams illustrating respective non-volatile programming operations of the apparatus of FIG. 1 according to an embodiment of the invention.
Figure 7B:
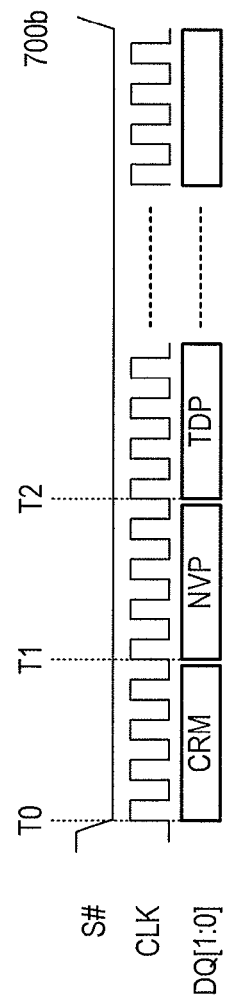
Figure 7C:
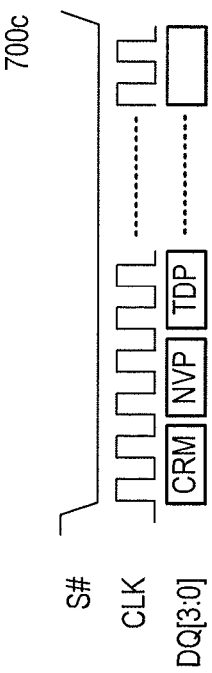

FIGS. 7a-c are timing diagrams 700a-c illustrating respective non-volatile programming (NVP) operations according to an embodiment of the invention. In an NVP operation, a tuning data pattern may be programmed to the non-volatile register 202. Programming a tuning data pattern in this manner may overwrite a previous tuning data pattern or may store an additional tuning data pattern in the non-volatile memory 202. In each of the timing diagrams 700a-c, at time T0, the memory 104 may receive a calibration register mode (CRM) command from the host 102. As illustrated in FIG. 7a, the CRM command may have a bit length of 8-bits and received over eight clock cycles of the clock signal CLK. Each bit of the command may be received at a rising edge of the clock signal CLK. In other embodiments, each bit may be received on a falling edge of the clock signal CLK or may be received on each rising and falling edges. Moreover, in some embodiments, the CRM command may have a length other than 8-bits, such as 16- or 32-bits. At time T1, the memory 104 receives an attribute from the host 102. As shown in each of the timing diagrams 700a-c, the attribute may comprise a NVP attribute that may cause the memory 104 to execute an NVP operation. At time T2, the memory 104 receives the tuning data pattern from the host 102. Based, at least in part, on the CRM command and the NVP attribute, the memory 104 may program the received tuning data pattern in the non-volatile register 202.

Although each of the timing diagrams 700a-c are directed to respective NVP operations, the number of clock cycles required to receive the CRM command, NVP attribute, and tuning data pattern in each of the timing diagrams 700a-c may vary. As an example, because the information is communicated over a single I/O line in timing diagram 700a and over two I/O lines in timing diagram 700b, the CRM command, NVP attribute, and tuning data pattern may be received by the memory 104 over a fewer number of clock cycles (e.g., one-half) in timing diagram 700b. Similarly, with respect to the timing diagram 700c, the CRM command, NVP attribute and tuning data pattern may be received on four I/O lines over a fewer number of clock cycles (e.g., one-half) than of timing diagram 700b.

Figure 8A:
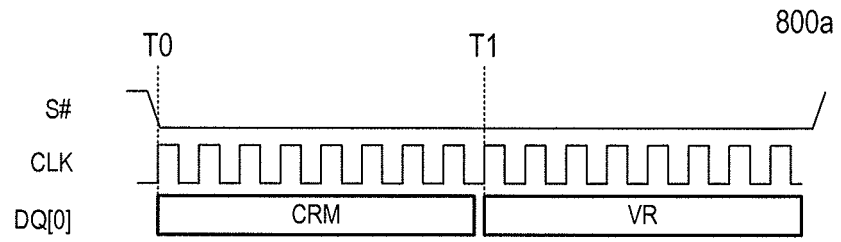
FIGS. 8a-c are timing diagrams illustrating respective volatile refresh operations of the apparatus of FIG. 1 according to an embodiment of the invention.
Figure 8B:
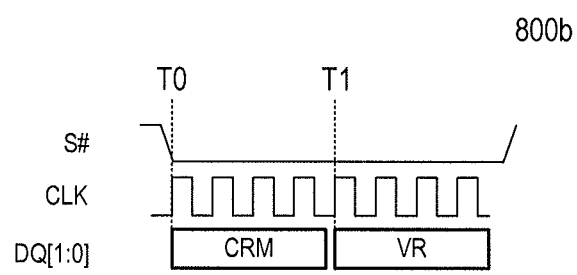
Figure 8C:
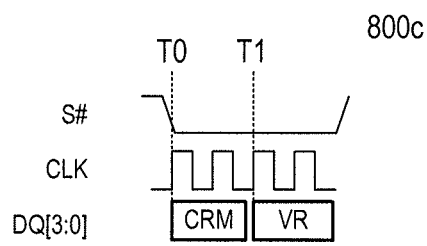

FIGS. 8a-c are timing diagrams 800a-c illustrating respective volatile refresh (VR) operations of the apparatus 100 according to an embodiment of the invention. In a VR operation, a tuning data pattern stored in the volatile register 204 may be refreshed by the memory 104. As an example, the VR operation may refresh the volatile register 204 with a tuning data pattern stored in the non-volatile register 202. As shown, in FIGS. 8a-8c, a CRM command may be received by the memory 104 at time T0 and may be followed by a VR attribute at time T1. A VR operation may not require that the host 102 provide the memory 104 with a tuning data pattern as a VR operation is directed to refreshing a tuning data pattern already stored in the memory 104. As described with respect to FIGS. 7a-c, the number of clock cycles over which the CRM command and VR attribute are received may be based, at least in part, on the number of I/O lines used. For example, the number of clock cycles over which the CRM command and VR attribute are received decreases with using an increasing number of I/O lines.

Figure 9A:
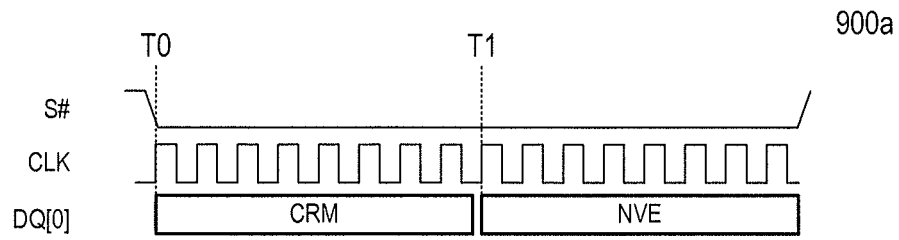
FIGS. 9a-c are timing diagrams illustrating respective non-volatile erase operations of the apparatus of FIG. 1 according to an embodiment of the invention.
Figure 9B:
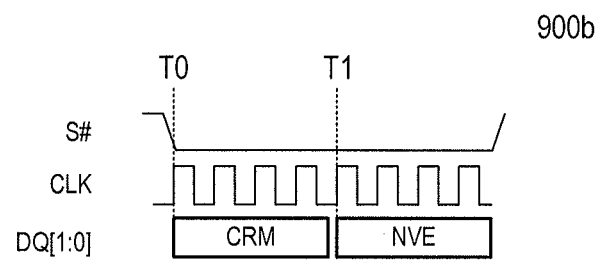
Figure 9C:
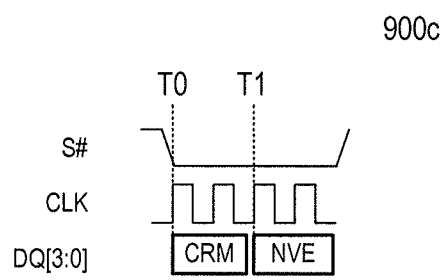

FIGS. 9a-c are timing diagrams 900a-c illustrating respective non-volatile erase (NVE) operations of the apparatus 100 according to an embodiment of the invention. In a NVE operation, a tuning data pattern stored in a non-volatile register 202 may be erased, for example, by formatting the non-volatile register 202 and/or erasing (e.g., programming with 0's) the memory cells in which the tuning data pattern is stored. As shown in each of the timing diagrams 900a-c, a CRM command may be received by the memory 104 at time T0, and an erase attribute may be received by the memory 104 at time T1. As described, the number of clock cycles for receiving the CRM command and NVE attribute may be based, at least in part, on the number of I/O lines used.

Figure 10A:
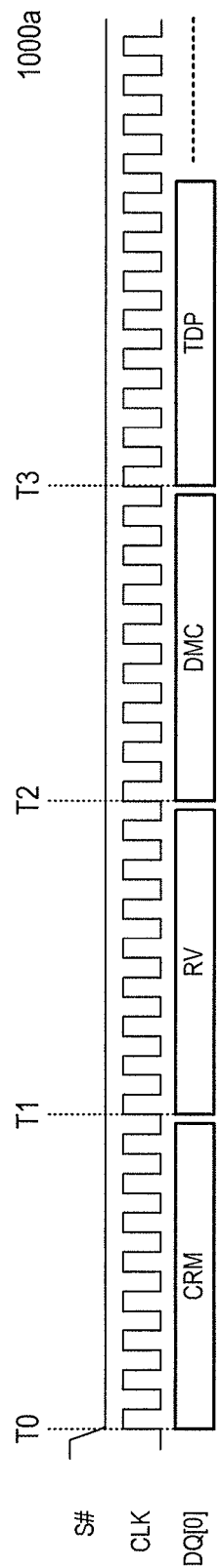
FIGS. 10 a-c are timing diagrams illustrating respective read volatile operations of the apparatus of FIG. 1 according to an embodiment of the invention.
Figure 10B:
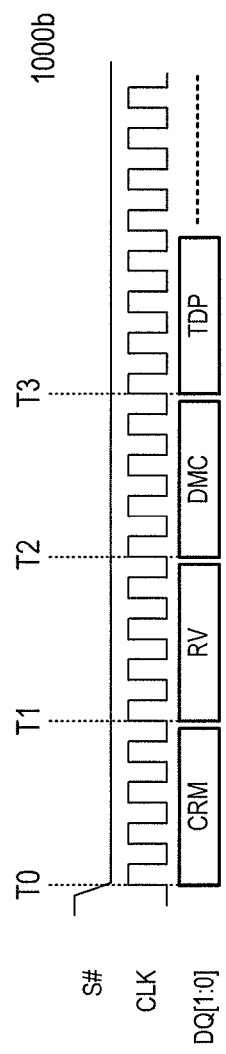
Figure 10C:
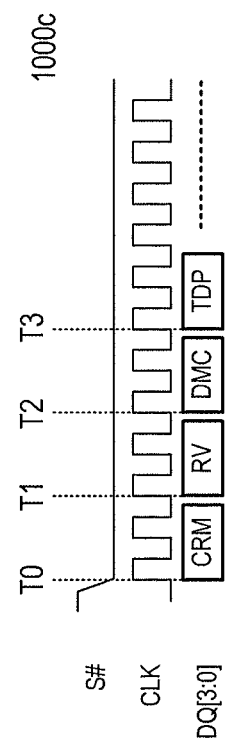

FIGS. 10a-c are timing diagrams 1000a-c illustrating a read volatile (RV) operation of the apparatus 100 according to an embodiment of the invention. In an RV operation, a tuning data pattern may be read from the volatile register 204. At times T0 and T1, the memory 104 may receive a CRM command and RV attribute, respectively. At time T2, "dummy cycles" (DMC) occur, during which the memory 104 may retrieve a tuning data pattern from the volatile register 204. The tuning data pattern is provided to the host 102 at time T3. The memory 104 may be configured to provide the tuning data pattern to the host 102 after a particular number of dummy cycles have elapsed. In the embodiments of FIGS. 10a-10c, the dummy cycles are between times T2 and T3. In one embodiment, the number of dummy cycles may be based, at least in part, on the amount of time required for the memory 104 to retrieve the tuning data pattern from the volatile register 204 and/or the non-volatile register 202.

FIGS. 11 a-c are timing diagrams 1100a-c illustrating a volatile program (VP) operation of the apparatus 100 according to an embodiment of the invention. In a VP operation, a tuning data pattern may be written to the volatile register 204 of the memory 104. At times T0 and T1, a CRM command and VP attribute may be received by the memory 104, respectively. At time T2, a tuning data pattern may be received by the memory 104, and the memory 104 may write the tuning data pattern to the volatile register 204. As described, the number of clock cycles for receiving the CRM command and VP attribute may be based, at least in part, on the number of I/O lines used.

Use of the VP operation may allow for a host 102 to calibrate using any desired tuning data pattern. For example, a host may write to the volatile register 204 using a VP operation, and may subsequently read from the volatile register 204 using an RV operation. Not only would this allow a host 102 to calibrate without changing a tuning data pattern stored in the non-volatile register 202, but a host 102 may use a tuning data pattern having a length, pattern, and/or frequency it programs. The tuning data pattern programmed in the volatile register 204 may be appropriate for the particular operating conditions. For example, in one embodiment, the host 102 may be configured to determine operating conditions, such as temperature or pressure, and use a VP operation to write a tuning data pattern to the volatile register 204 that allows the host 102 to effectively calibrate a sampling point for the current operating conditions.

Figure 12A:
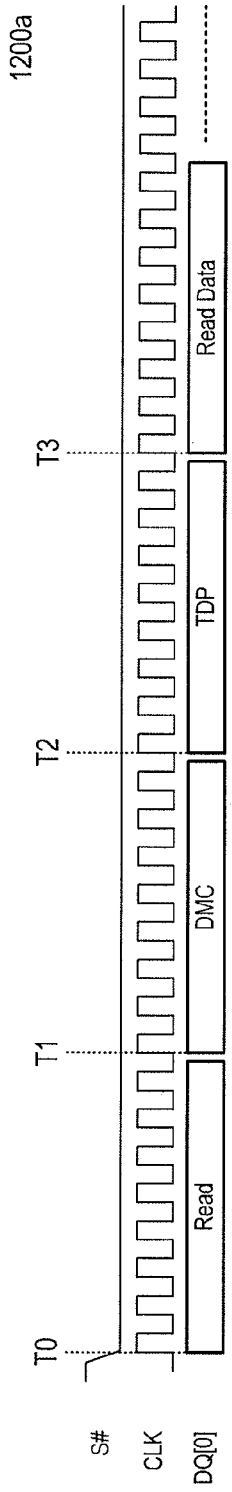
FIGS. 12a-c are timing diagrams illustrating the a read command operation of the apparatus of FIG. 1 according to an embodiment of the invention.
Figure 12B:
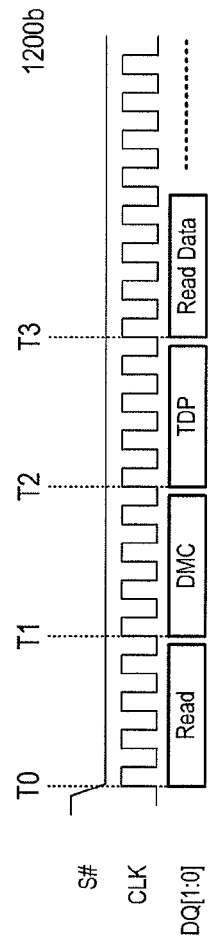
Figure 12C:
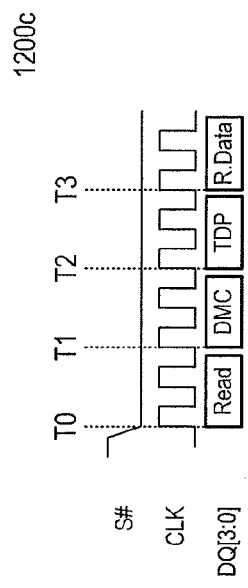

FIGS. 12a-c are timing diagrams 1200a-c illustrating execution of a read command by the apparatus 100 according to an embodiment of the invention. As described, in a short calibration mode, the memory 104 may provide a tuning data pattern to the host 102 prior to providing data in response to a read command. Thus, with respect to timing diagrams 1200a-c, at time T0, a read command may be received by the memory 104. At time T1, the memory 104 may begin to retrieve the requested data and a tuning data pattern, and after a number of dummy cycles, the memory 104 may provide the tuning data pattern to the host 102 at time T2. The number of dummy cycles may be based, at least in part, on the amount of time for the memory 104 to retrieve the data and/or the tuning data pattern. As previously discussed, the host 102 may use the tuning data pattern to calibrate a sampling point, and consequently, at time T3, the memory 104 may provide the requested data to the host 102, and the host 102 may capture the data using the calibrated sampling point. As shown, the number of clock cycles required to execute the read operation may be based, at least in part, on the number of I/O lines used.

Figure 13:
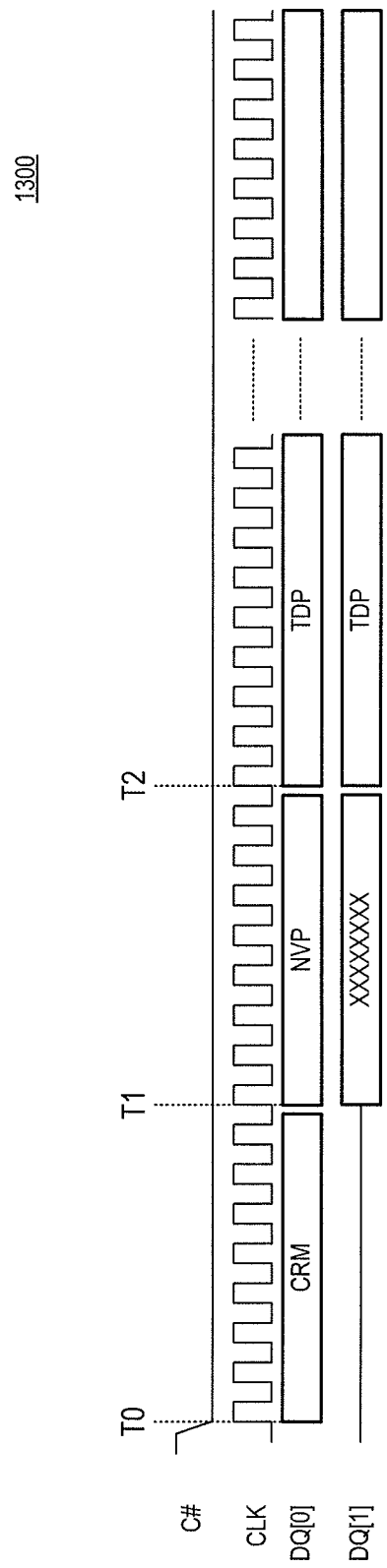
FIG. 13 is a timing diagram illustrating a multi-input operation of the apparatus of FIG. 1 according to an embodiment of the invention.

FIG. 13 is a timing diagram 1300 illustrating a multi-input operation of the apparatus 100 according to an embodiment of the invention. A multi-input operation may comprise executing a same operation with the apparatus 100 independently on separate I/O lines of the SPI bus 106. While the following description is made with reference to a multi-input NVP operation occurring on two I/O lines, it will be appreciated that any number of I/O lines, such as four or eight, could be used to execute the multi-input operation, and any operation may be used for a multi-input operation, including, but not limited to, NVP, VP, NVE, VR, and RV operations.

At time T0, the memory 104 receives a CRM command from the host 102 on a single I/O line. Following the command, at time T1, the memory 104 receives an attribute on the same I/O line. The memory 104 may also receive data on other lines of the SPI bus, but this data may be ignored by the memory 104 and bits of the data may accordingly be considered "don't cares" (shown in FIG. 13 as "XXXX"s). At time T2, responsive to the CRM command and NVP attribute, the memory 104 may receive a tuning data pattern on each of the I/O lines. The memory 104 may program each of the received tuning data patterns in the non-volatile register 202 and in some embodiments may correlate each with the I/O line in which the tuning data pattern was received. The tuning data patterns received on each of the I/O lines may be the same or may be different.

With reference to FIGS. 7 and 13, for both an NVP operation and a multi-input NVP operation, a CRM command and attribute may be received by the memory 104 on a single I/O line. Accordingly, to allow the memory 104 to distinguish between the two types of operations, the attribute provided with the CRM command may be one or more bits indicating the desired type of operation. The attribute may, for example, indicate whether an operation is to occur over a single I/O line or multiple I/O lines, and/or may further indicate the number of lines (e.g., 2, 3, or 4) if the operation is a multi-input operation.

Figure 14:
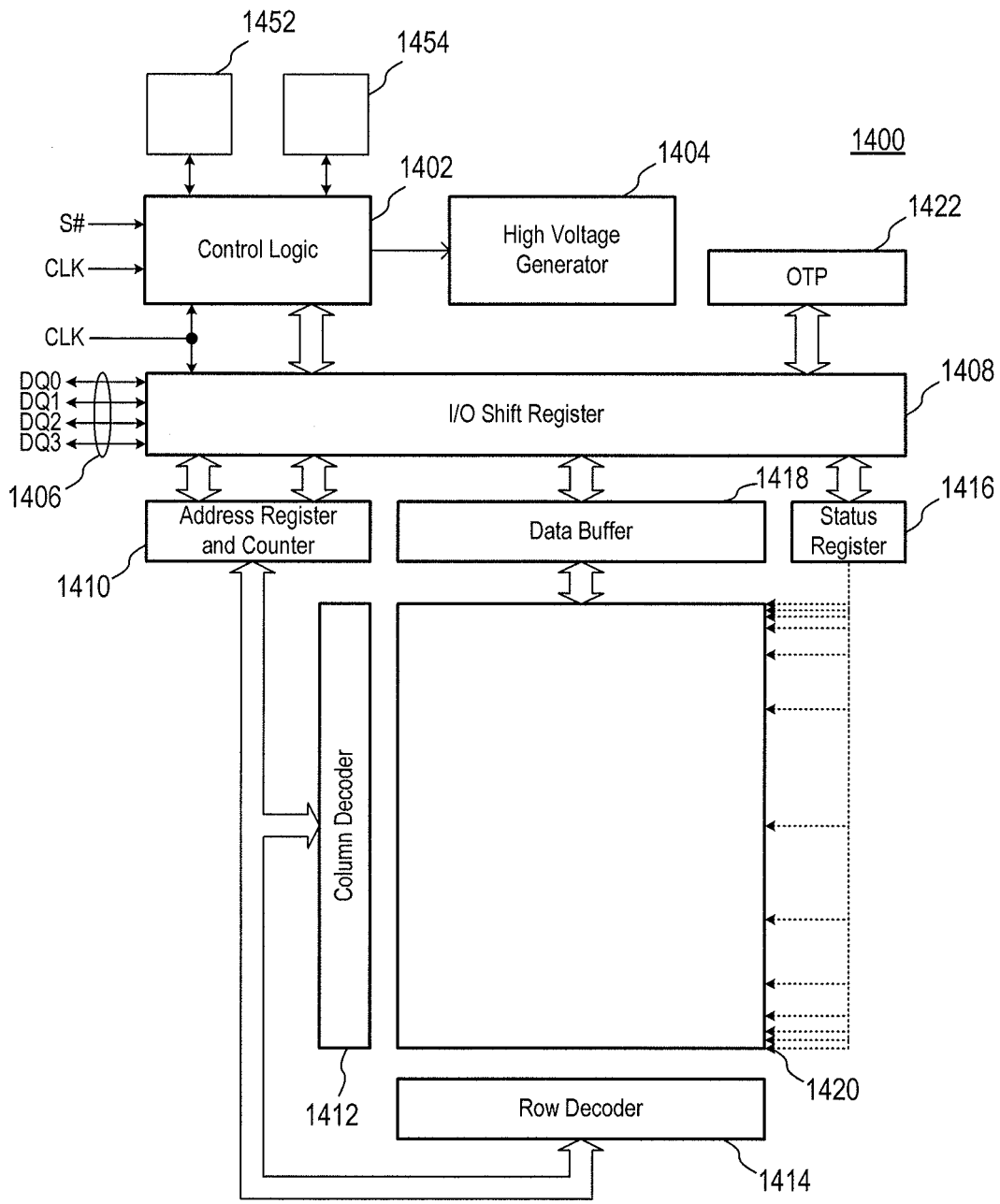
FIG. 14 is a block diagram of a memory according to an embodiment of the invention.

FIG. 14 is a block diagram of a memory 1400 according to an embodiment of the invention. The memory 1400 may be used to implement the memory 104 of FIG. 1. The memory 1400 may include control logic 1402 configured to receive a slave select signal S# and a clock signal CLK in accordance with the SPI protocol. Commands, addresses and data may be received over one or more of the I/O lines of an SPI bus 1406 and loaded into a data buffer 1418 by shift register 1408 for temporary storage before the data is written to or after the data is read from memory cells of array 1420. The SPI bus 1406 may be similar to the SPI bus 106 and will not be discussed further in the interest of brevity. The address to which data is read from or written to may be provided from address register and counter 1410 and subsequently decoded by column decoder 1412 and row decoder 1414. A one-time programmable (OTP) register 1422 may include one-time programmable non-volatile memory that may, for instance, be used to store manufacturing, operational, and/or security information pertaining to the memory 1400. A status register 1416 may provide indications directed to statuses of the memory 1400, such as for various state machines (not shown) and operating states of the array 1420.

In operation, the memory 1400 may receive commands, addresses, and data over the SPI bus 1406. As known, the control logic 1402 may receive the command, determine which operation to execute in response to the command (e.g., read, write, or erase), and further determine whether the operation is a high voltage operation. If the control logic 1402 determines that an operation is a high voltage operation (e.g., write or erase), the control logic 1402 will cause a high voltage generator 1404 to initiate the high voltage operation. Conversely, if the operation is not a high voltage operation, the control logic 1402 may execute the operation. In a read operation, for example, the control logic 1402 may cause the column decoder 1412 and row decoder 1414 to locate data in the array 1420 based, at least in part, on an address provided by the address register and counter 1410. In response to the read operation, the array 1420 may provide data corresponding to the address to a data buffer 1418, and the data may be subsequently provided to the SPI bus 1406.

As described, in some embodiments, information received by the memory 1400 may include a calibration register mode command and an attribute, wherein the memory 1400 may execute one or more operations directed to tuning data patterns. Thus, the memory 1400 may further include a non-volatile register 1452 and a volatile register 1454. The non-volatile register 1452 and volatile register 1454 may be similar to the non-volatile register 202 and volatile register 204 of FIG. 2, respectively, and may be coupled to the control logic 1402. In response to a calibration register mode command and subsequent attribute, the control logic 1402 may execute operations on tuning data patterns stored in the non-volatile register 1452 and/or volatile register 1454, as described above.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus, comprising:
a device configured to provide a calibration command and an attribute, the device further configured to provide a clock signal, wherein the device is further configured to vary a frequency of the clock signal;
a memory configured to receive the calibration command, the clock signal, and the attribute, the memory comprising:
a first register configured to store a tuning data pattern; and
a second register configured to receive and store a tuning data pattern responsive, at least in part, to the memory receiving a calibration command; and
wherein the memory is further configured to execute an operation on at least one of the tuning data pattern stored in the first register or the tuning data pattern stored in the second register based, at least in part, on the attribute, and wherein the memory is configured to receive the clock signal, the memory further configured to execute the operation based, at least in part, on the clock signal.

2. The apparatus of claim 1, wherein the calibration command and attribute are received by the memory over a plurality of I/O lines.

3. The apparatus of claim 1, wherein the first register comprises non-volatile memory and the second register comprises volatile memory.

4. The apparatus of claim 1, wherein the operation comprises a read volatile operation and wherein the memory is configured to provide the tuning data pattern stored in the second register after a plurality of dummy cycles have elapsed after receipt of the attribute.

5. The apparatus of claim 1, wherein the attribute corresponds to a multi-input operation.

6. The apparatus of claim 1, wherein the attribute is a non-volatile programming attribute, volatile refresh attribute, non-volatile erase attribute, read volatile attribute, or volatile program attribute.

7. The apparatus of claim 1, wherein the tuning data pattern stored in the first register is based, at least in part, on silicon processes, PCB loads, voltage variations, temperature fluctuations, or any combination thereof.

8. The apparatus of claim 1, wherein the second register is further configured to receive a plurality of tuning data patterns responsive at least in part, to the memory receiving the calibration command.

9. An apparatus, comprising:
a memory configured to receive a read command, the memory further configured to provide a tuning data pattern responsive, at least in part, to receipt of the read command and to provide the tuning data pattern after a plurality of dummy cycles have elapsed after receipt of the read command, wherein the memory is further configured to provide the tuning data pattern based, at least in part, on a short calibration flag.

10. The apparatus of claim 9, wherein the memory is further configured to operate in accordance with the SPI protocol.

11. The apparatus of claim 9, wherein the memory is further configured to provide data corresponding to the read command after providing the tuning data pattern.

12. The apparatus of claim 9, further comprising a bus having a plurality of I/O lines and wherein the read command is provided over the plurality of I/O lines.

13. The apparatus of claim 9, wherein the memory is configured to provide a plurality of tuning data patterns on a plurality of I/O lines, wherein at least one of the tuning data patterns being different than another one of the tuning data patterns.

14. A method, comprising:
providing a tuning data pattern at a first frequency responsive, at least in part, to receipt of a clock signal having a first frequency; and
providing the tuning data pattern at a second frequency responsive, at least in part, to receipt of a clock signal having a second frequency.

15. The method of claim 14, wherein providing the tuning data pattern comprises providing the tuning data pattern responsive, at least in part, to receipt of a calibration command and an attribute.

16. The method of claim 14, further comprising:
comparing the tuning data pattern provided at the first frequency and the tuning data pattern provided at the second frequency.

17. The method of claim 16, wherein providing the tuning data patterns comprises providing the tuning data patterns from a memory coupled to a device, the method further comprising:
determining a sample point based, at least in part, on said comparing the tuning data pattern provided at the first frequency and the tuning data pattern provided at the second frequency at the device.

18. The method of claim 14, wherein said providing a tuning data pattern at a first:
frequency comprises providing the tuning data pattern from a memory over a plurality of I/O lines.

19. The method of claim 14, wherein providing the tuning data pattern comprises providing the tuning data pattern responsive, at least in part, to receipt of a read volatile attribute.

20. The method of claim 14, wherein the second frequency is greater than the first frequency.

21. A method, comprising:
receiving at a memory a read command;
providing a tuning data pattern responsive, at least in part, to receipt of the read command, wherein providing the tuning data pattern comprises:
determining the status of a short calibration flag; and
if it is determined that the short calibration flag has an enabled state, providing the tuning data pattern; and
after providing the tuning data pattern from the memory, providing read data corresponding to the read command.

22. The method of claim 21, further comprising:
before said providing a tuning data pattern, waiting for a plurality of dummy cycles to elapse after receipt of the read command.

23. The method of claim 21, wherein said providing from the memory a tuning data pattern further comprises:
providing the tuning data pattern from a non-volatile memory to a volatile memory; and
providing the tuning data pattern from the volatile memory.

24. A method, comprising:
receiving a calibration command;
receiving a clock signal at a first frequency;
providing a tuning data pattern from a first register to a second register responsive, at least in part, to receipt of the calibration command;
receiving a clock signal at a second frequency;
receiving an attribute; and
executing an operation on the tuning data pattern based, at least in part, on the attribute and the clock signal at the first frequency or the second frequency.

25. The method of claim 24, wherein the tuning data pattern is a first data tuning pattern, the method further comprising:
after said receiving the attribute, receiving a second tuning data pattern.

26. The method of claim 25, wherein receiving a second tuning data pattern comprises storing the second tuning data pattern in the first register, and wherein the method further comprises providing the second tuning data pattern from the first register to the second register.

27. The method of claim 24, further comprising:
after said receiving the attribute, waiting for a plurality of dummy cycles to elapse.

28. The method of claim 24, wherein said executing an operation comprises:
providing the tuning data pattern from the second register to a bus.

* * * * *